US010860126B2

(12) United States Patent
Lee et al.

(10) Patent No.: US 10,860,126 B2
(45) Date of Patent: Dec. 8, 2020

(54) DISPLAY DEVICE WITH BUILT-IN TOUCH SENSORS

(71) Applicant: LG Display Co., Ltd., Seoul (KR)

(72) Inventors: Joohee Lee, Paju-si (KR); Moonsoo Chung, Paju-si (KR); Yonghwa Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 65 days.

(21) Appl. No.: 16/192,588

(22) Filed: Nov. 15, 2018

(65) Prior Publication Data

US 2019/0155431 A1 May 23, 2019

(30) Foreign Application Priority Data

Nov. 17, 2017 (KR) .................... 10-2017-0153999

(51) Int. Cl.
*G06F 3/041* (2006.01)
*G09G 3/22* (2006.01)
*H03M 1/12* (2006.01)
*G06F 3/044* (2006.01)
*G09G 3/20* (2006.01)

(52) U.S. Cl.
CPC .......... *G06F 3/0412* (2013.01); *G06F 3/0443* (2019.05); *G06F 3/04166* (2019.05); *G09G 3/2092* (2013.01); *G09G 3/22* (2013.01); *H03M 1/12* (2013.01); *G09G 2310/08* (2013.01); *G09G 2354/00* (2013.01)

(58) Field of Classification Search
CPC ...... G06F 3/22; G06F 3/04166; G06F 3/0443; G06F 3/2092
USPC ................................................. 345/173, 174
See application file for complete search history.

(56) References Cited

U.S. PATENT DOCUMENTS

| 8,711,119 B2* | 4/2014 | Liu ....................... G06F 3/0416 345/173 |
| 9,927,925 B2* | 3/2018 | Teranishi .............. G06F 3/0446 |
| 2013/0249845 A1* | 9/2013 | Lee ....................... G06F 1/1626 345/173 |
| 2014/0085172 A1* | 3/2014 | Wu ...................... G09G 3/2092 345/84 |
| 2015/0040070 A1* | 2/2015 | Yamano ............. G06F 3/04886 715/835 |

* cited by examiner

*Primary Examiner* — Calvin C Ma
(74) *Attorney, Agent, or Firm* — Seed IP Law Group LLP

(57) ABSTRACT

A display device with built-in touch sensors comprises: a display panel with built-in touch sensors; and a touch driver that converts a sensed voltage of the touch sensors into sensed data, wherein the touch driver comprises: an enable signal generator that compares the sensed voltage with a preset offset voltage and outputs an enable signal at a first level if the sensed voltage is higher than or equal to the offset voltage and outputs the enable signal at a second level if the sensed voltage is lower than the offset voltage; and an analog-to-digital converter that converts the sensed voltage into the sensed data when the enable signal is at the first level.

14 Claims, 11 Drawing Sheets

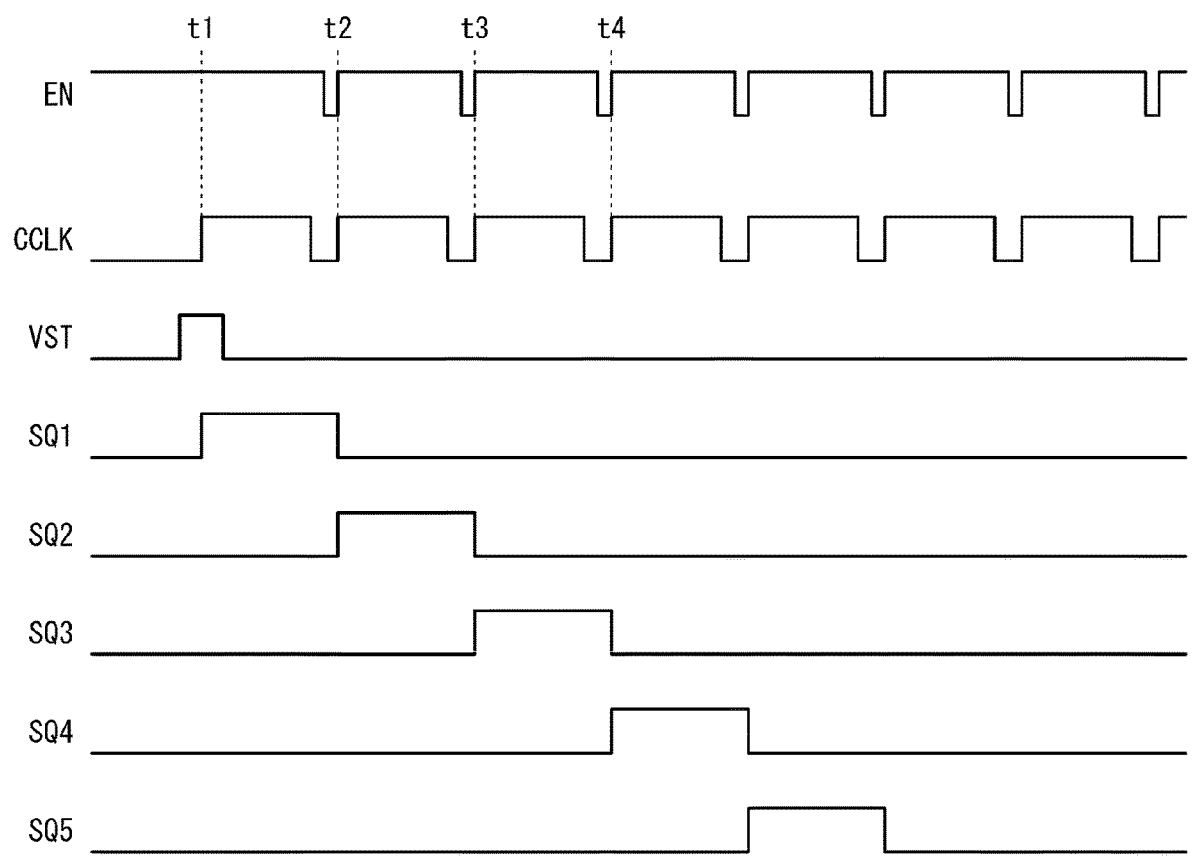

DISPLAY DEVICE WITH BUILT-IN TOUCH SENSORS

CROSS-REFERENCE TO RELATED APPLICATION(S)

This application claims the benefit of Korean Patent Application No. 10-2017-0153999, filed on Nov. 17, 2017, which is incorporated herein by reference for all purposes as if fully set forth herein.

BACKGROUND

Technical Field

The present disclosure relates to a display device with built-in touch sensors.

Description of the Related Art

In recent years, flat-panel displays (or display devices) that can be made in large sizes, are cheap, and offer high display quality (video representation, resolution, brightness, contrast ratio, color reproducibility, etc.) are being actively developed, in order to meet the need for display devices capable of properly displaying multimedia content, along with multimedia development. For such flat-panel displays, various input devices, such as a keyboard, a mouse, a trackball, a joystick, a digitizer, etc., may be used to configure an interface between a user and a display device.

Recently, a touch sensor was proposed which detects an input when the user enters information while viewing the display device by directly touching the screen with their hand or a pen or moving it near the screen.

Touch sensors for use in display devices may be implemented as in-cell touch sensors that are embedded in a display panel. An in-cell touch display uses a method in which a touch sensor's touch electrode and the display panel's common electrode are used together. Here, driving is done in a time-sharing manner, separately in a display period and a touch driving period.

Since the display panel and the touch sensors are driven in a time-sharing manner, the driving time is not sufficient. Moreover, the lack of time for driving the touch sensors leads to a touch sensitivity problem. A long touch driving period is needed to drive the touch sensors when an analog digital converter converts a sensed voltage from a touch sensor into sensed data. Increasing the number of analog digital converters to reduce the touch driving period has some disadvantages, such as high costs and making the display device larger in size.

BRIEF SUMMARY

An exemplary embodiment of the present disclosure provides display device with built-in touch sensors comprises: a display panel with built-in touch sensors; and a touch driver that converts a sensed voltage of the touch sensors into sensed data, wherein the touch driver comprises: an enable signal g enerator that compares the sensed voltage with a preset offset voltage and outputs an enable signal at a first level if the sensed voltage is higher than or equal to the offset voltage and outputs the enable signal at a second level if the sensed voltage is lower than the offset voltage; and an analog-to-digital converter that converts the sensed voltage into the sensed data when the enable signal is at the first level.

BRIEF DESCRIPTION OF THE SEVERAL VIEWS OF THE DRAWINGS

The accompany drawings, which are included to provide a further understanding of the disclosure and are incorporated on and constitute a part of this specification, illustrate embodiments of the disclosure and together with the description serve to explain the principles of the disclosure. In the drawings:

FIGS. 8 to 10 are views showing embodiments in which a multiplexer controller outputs switching control signals.

DETAILED DESCRIPTION

Figure 1:
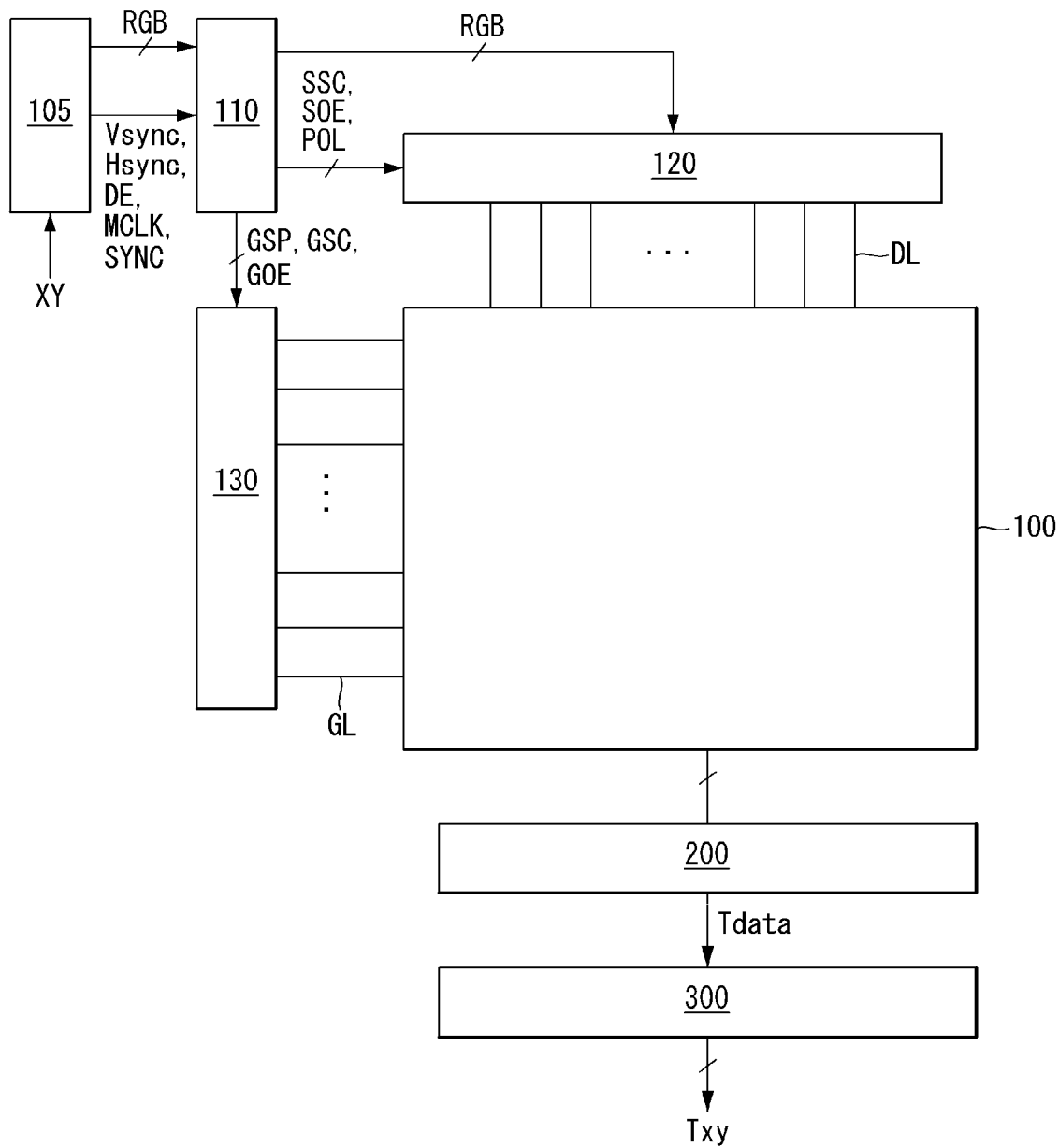
FIG. 1 is a view of a display device with built-in touch sensors according to the present disclosure.

Hereinafter, exemplary embodiments of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. The terms and names of elements used herein are chosen for ease of description and may be different from the names of parts used in actual products.

Figure 2:
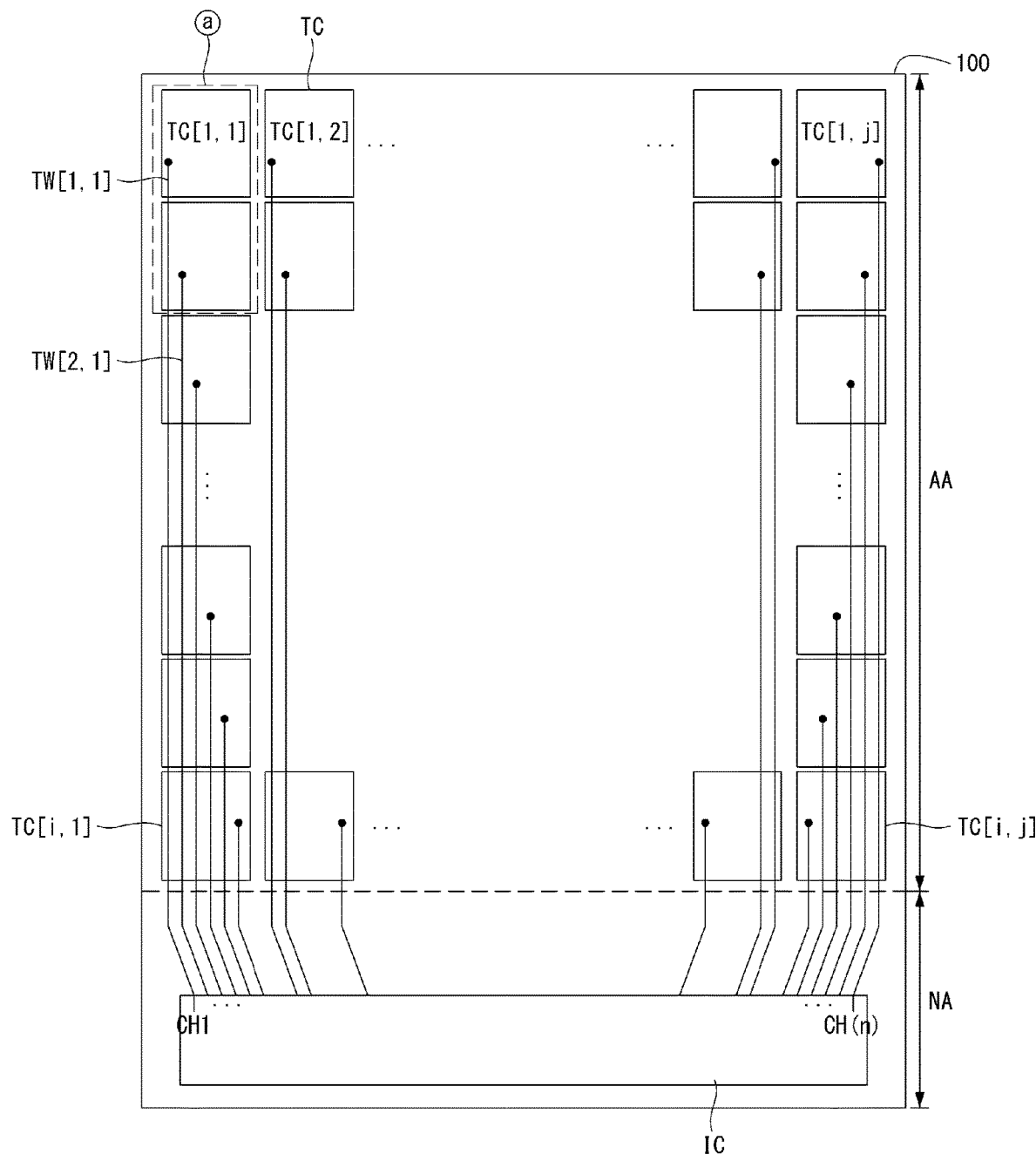
FIG. 2 is a view showing an array structure of a display panel.
Figure 3:
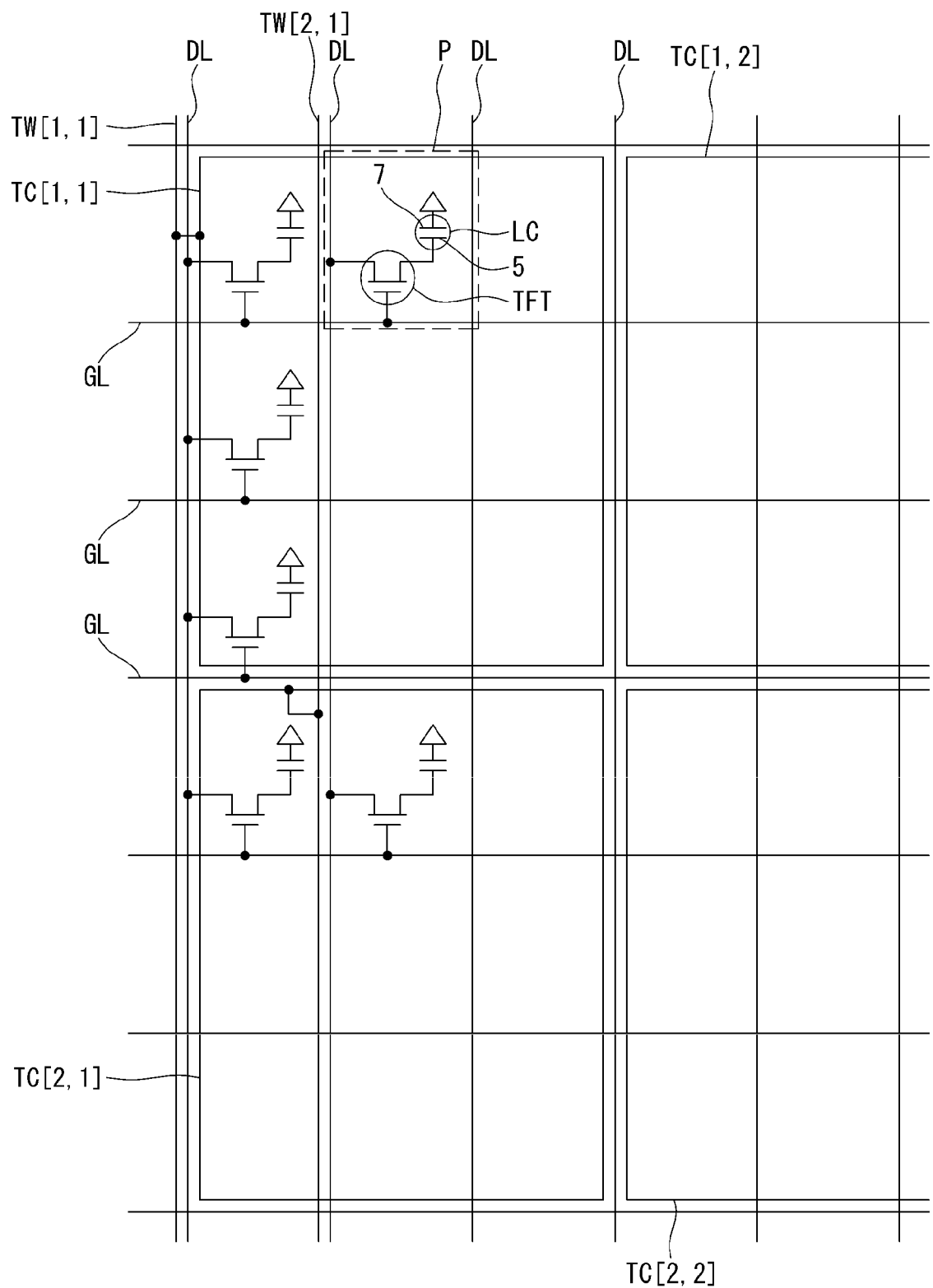
FIG. 3 is an enlarged view of part of a pixel array shown in FIG. 2.

FIG. 1 is a view of a display device with built-in touch sensors according to the present disclosure. FIG. 2 is a view showing a display panel. FIG. 3 is a view showing part of a display area shown in FIG. 2. Although individual touch sensors and sensing lines in FIGS. 2 and 3 are indicated by the respective reference numerals, they will be referred to as touch sensors TC and sensing lines TW in the detailed description when commonly designated regardless of their position.

Referring to FIGS. 1 to 3, a display device with built-in touch sensors according to the present disclosure comprises a display panel 100, a host system 105, a timing controller 110, a data driver 120, a gate driver 130, a touch driver 200, and a touch coordinate generator 300.

The display panel 100 comprises pixels P and touch sensors TC. The display panel 100 comprises an upper substrate and a lower substrate that face each other, with a liquid crystal layer LC in between. A pixel array on the display panel 100 comprises data lines DL, gate lines GL, thin-film transistors TFT formed at the intersections of the data lines DL and the gate lines GL, pixel electrodes 5 connected to the thin-film transistors TFT, and storage capacitors Cst connected to the pixel electrodes 5. The thin-film transistors TFT turn on in response to gate pulses from the gate lines GL, and supply the pixel electrodes 5 with data voltages applied through the data lines DL. A liquid crystal layer LC is driven by the voltage difference between the data voltages stored in the pixel electrodes 5 and a common voltage Vcom applied to a touch common electrode 7 to adjust the amount of light transmission.

The touch sensors TC are connected to a plurality of pixels, and implemented as capacitive touch sensors to sense touch input. A plurality of pixels P are coupled to each touch sensor TC. The common electrode 7 is coupled to each touch sensor TC, and, as a result, the area occupied by the common electrode 7 may be designated as the touch sensors TC. One sensing line TW is allocated and connected to each touch sensor TC. For example, the sensing line TW[1,1] in the first row and first column is connected to the touch sensor TC[1,1] in the first row and first column, and the sensing line TW[1,2] in the first row and second column is connected to the touch sensor TC[1,2] in the first row and second column. FIG. 2 depicts touch sensors TC arranged in i rows and j columns.

The common electrode 7 is supplied with a common voltage VCOM, which is a reference voltage for the pixels, during a display period, and is supplied with a touch drive voltage during a touch driving period.

The timing controller 110 receives timing signals such as a vertical synchronization signal Vsync, a horizontal synchronization signal Hsync, a data enable signal DE, a main clock MCLK, etc., from a host system 105, and synchronizes the operation timings of the data driver 120 and gate driver 130. Gate timing control comprise a gate start pulse GSP, a gate shift clock GSC, a gate output enable signal GOE, etc. Data timing control signals comprise a source sampling clock SSC, a source output enable signal SOE, etc.

The host system 105 may be implemented as any one of the following: a television system, a set-top box, a navigation system, a DVD player, a Blue-ray player, a personal computer PC, a home theater system, and a phone system. The host system 105 comprises a system-on-chip (SoC) with a scaler embedded in it, and converts digital video data RGB of an input image into a format suitable for display on the display panel DIS. The host system 105 transmits the timing signals Vsync, Hsync, DE, and MCLK, along with the digital video data, to the timing controller 110. Moreover, the host system 105 executes an application program associated with coordinate information (Txy) of touch data input from the touch coordinate generator 300.

The data driver 120 receives image data from the timing controller 110 and converts it to positive/negative gamma compensation voltages and outputs positive/negative data voltages. The data voltages are supplied to the data lines DL.

The gate driver 130 sequentially supplies gate pulses to the gate lines GL under the control of the timing controller 110. The gate pulses output from the gate driver 130 are synchronized with the data voltages. The gate driver 130 may be directly formed on the lower substrate of the display panel 100, along with the pixel array, through a gate-in-panel (GIP) process.

The touch driver 200 receives a sensed voltage from a touch sensor TC, and converts the sensed voltage into digital sensed data Tdata. The touch driver 200 transmits the sensed data Tdata obtained by driving the touch sensor TC to the touch coordinate generator 300.

The touch coordinate generator 300 executes a preset touch recognition algorithm. The touch recognition algorithm compares touch raw data received from a touch sensor TC sensed with a predetermined threshold value, and identifies the touch raw data as touch input data obtained from touch sensors TC at a touch input position if the touch raw data is higher than the threshold value. The touch recognition algorithm allocates an identification code to each touch input data that is higher than the threshold value, and calculates the coordinates of each touch input position. The touch coordinate generator 300 may transmit to the host system 105 the identification code and touch coordinate information Txy of each touch input data.

The timing controller 110, data driver 120, gate driver 130, touch driver 200, and touch coordinate generator 300 may be mounted in one integrated circuit IC and bonded to the display panel 100, as shown in FIG. 2

Figure 4:
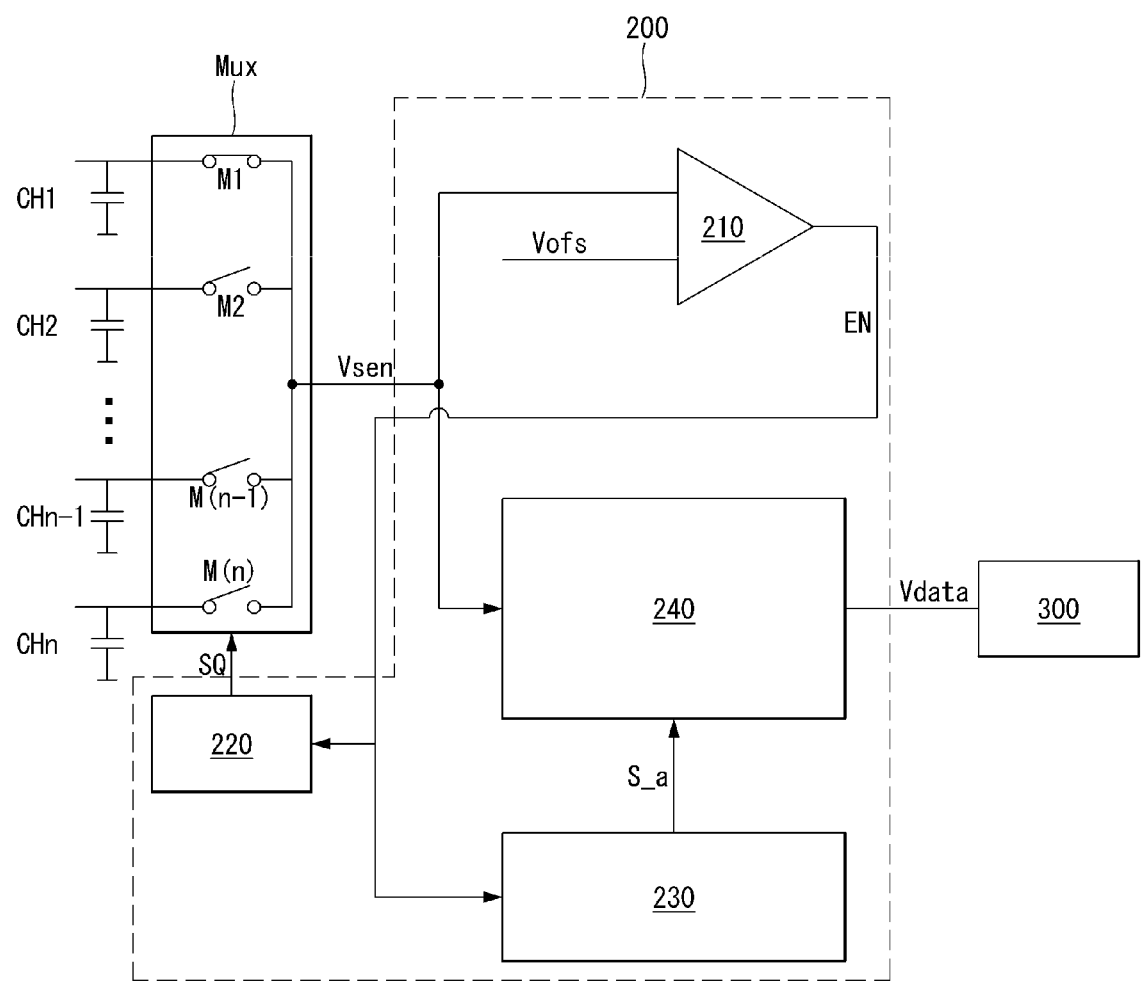
FIG. 4 is a view showing the configuration of a touch driver according to the present disclosure.

FIG. 4 is a view showing the configuration of a touch driver according to the present disclosure.

Referring to FIG. 4, the touch driver 200 according to the present disclosure comprises a multiplexer Mux, an enable signal generator 210, a multiplexer controller 220, an ADC controller 230, and an analog-to-digital converter (hereinafter, ADC) 240.

The multiplexer Mux comprises first to nth switches M1 to Mn that selectively connect channels CH1 to CHn and a multiplexer output end Mout. Each of the channels CH1 to CHn is connected to a sensing line TW and receives a sensed voltage Vsen from the sensing line TW. If there are i×j touch sensors TC, the number (n) of channels CH1 to CHn is i×j. First to nth switches M1 to Mn of the multiplexer Mux connect one of the sensing lines TW and the enable signal generator 210, in response to an enable signal EN outputted from the multiplexer controller 220.

The enable signal generator 210 compares a sensed voltage, which may also be called a sensed voltage Vsen, outputted through the multiplexer Mux and obtained by a certain sensing line TW, with an offset voltage Vofs, that can also be termed a threshold voltage or a reference voltage. The enable signal generator determines the voltage level of the enable signal EN based on the comparison with the threshold voltage, namely, Vofs, and the sensed voltage Vsen. The enable singal EN has a first voltage level or second voltage level depending on the relative values of the sensed voltage Vsen and offset voltage Vofs. In this specification, a description will be given with respect to an exemplary embodiment in which, if the sensed voltage Vsen is higher than or equal to the offset voltage Vofs, the enable signal generator 210 outputs an enable signal EN at high level, which is a first voltage level, and if the sensed voltage Vsen is lower than the offset voltage Vofs, the enable signal generator 210 outputs an enable signal EN at low level, which is a second voltage level.

The value of the offset voltage Vofs is selected and then set based on the desired sensitivity of the system to being touched. It is set to be lower than a voltage level at which the ADC 240 regards the sensed voltage Vsen as being valid touch data Tdata. If the offset voltage Vofs is set too low, the number of operations of the ADC 240 increases and many signals are output as being touches which might not be valid touches. If the offset voltage Vof is high, sensitivity may be degraded and a valid touch might be not reconginzed. The offset voltage Vofs may be set within a range in which the number of operations and outputs as touches from the ADC 240 can be efficiently reduced without degrading sensitivity.

The multiplexer controller 220 outputs switching control signals SQ in response to an enable signal EN. The switching control signals SQ control the operation of the switches M1 to Mn. A detailed configuration of the multiplexer controller 220 will be described below.

Figure 5:
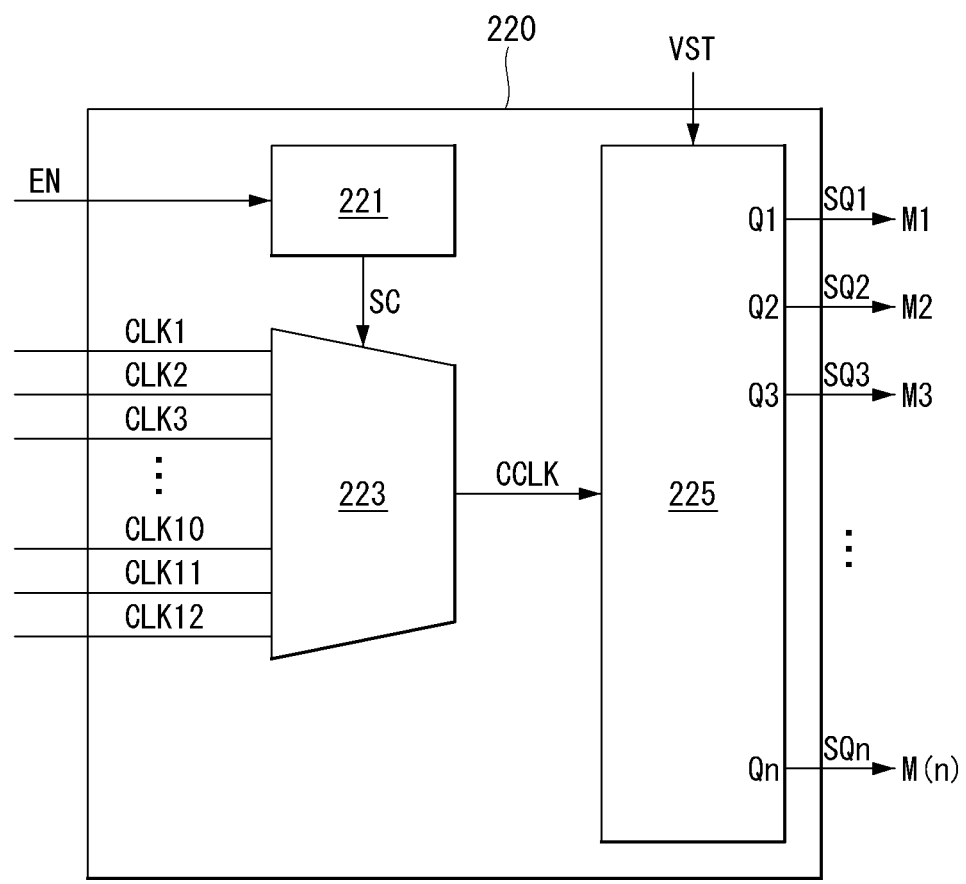
FIG. 5 is a view showing a multiplexer controller according to the present disclosure.

Viewing FIG. 4, the ADC controller 230 receives an enable signal EN and outputs an ADC control signal S_a. The ADC control signal S_a controls the operation of the ADC 240. An output period of the ADC control signal S_a varies with the voltage level of the enable signal EN. The output period of the ADC control signal S_a when the enable signal EN is applied at high level is set longer than the output period of the ADC control signal S_a when the enable signal EN is applied at low level. If the enable signal EN is applied at a high level, the sensed voltage Vsen may be estimated to be a voltage obtained by changing the sensed voltage Vsen by an intended touch operation by a user. Thus, the ADC 240 needs to change the sensed voltage Vsen to touch data Tdata. Accordingly, if the enable signal EN is at high level, the ADC control signal S_a has an output period in which the ADC 240 can be run during one sensed period 1T. On the contrary, if the enable signal EN is at low level, the sensed voltage Vsen may not be regarded as touch operation, so the ADC 240 does not need to be run. Thus, the controller 230 may reduce the time needed to sense all channels CH1 to CHn of the display panel 100 by reducing the ADC output period. FIG. 5 is a view showing a multiplexer controller.

Referring to FIG. 5, the multiplexer controller 220 comprises a counter 221, a clock output part 223, and a shift register 225.

The counter 221 receives an enable signal EN and counts the number of times the enable signal EN is inputted at low level during a touch driving period. The counter 221 outputs a clock selection control signal SC at the point in time when the enable signal EN is inputted. The clock selection control signal SC varies depending on the number of times the enable signal EN is inputted at low level. The clock selection control signal SC may comprise first to twelfth clock selection control signals SC1 to SC12, as shown in Table 1 to be described later. The counter 221 applies an initial clock selection control signal SC to the clock output part 223 at the point in time when the touch driving period starts. The counter 221 maintains the output of the first clock selection control signal SC1 while the enable signal EN is not inverted to low level.

The clock output part 223 receives the first to twelfth clock signals SC1 to SC12 and the clock selection control signal SC and outputs a control clock signal CCLK.

The shift register 225 receives a start signal VST and a control clock signal CCLK outputted from the clock output part 223, and charges output nodes Q1 to Qn with a turn-on voltage. In this specification, a description will be given with respect to an exemplary embodiment in which, when the output nodes Q1 to Qn are turned on at high-level voltage, the output nodes Q1 to Qn output switch control signals SQ1 to SQn of the turn-on voltage.

A first switch control signal SQ1 outputted from the first output node Q1 controls the operation of the first switch M1, and a second switch control signal SQ2 outputted from the second output node Q2 controls the operation of the second switch M2. Likewise, an nth switch control signal SQn outputted from the nth output node Mn controls the operation of the nth switch Mn. The charging period of each of the output nodes Q1 to Qn varies with the control clock signal CCLK.

Figure 6:
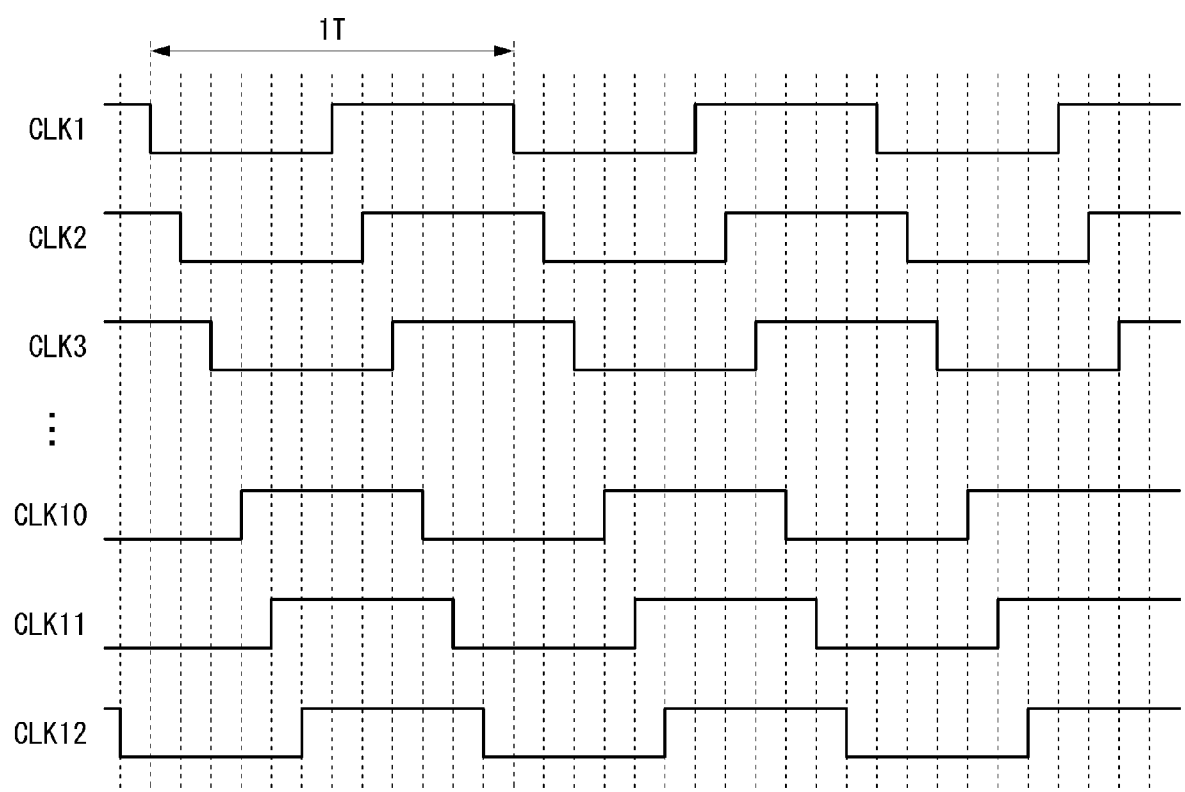
FIG. 6 is a view showing an embodiment of a clock signal applied to a clock output part.

FIG. 6 is a view showing first to twelfth clock signals supplied to the clock output part 223.

Referring to FIG. 6, one cycle of each of the first to twelfth clock signals CLK1 to CLK12 is set longer than or equal to one sensed period 1T and has a phase difference of 1/12 of one cycle. One sensed period is set longer than the time it takes for the ADC 240 to convert a sensed voltage Vsen received from one channel CH into touch data Tdata.

Table 1 is a table showing clock selection control signals SC the counter 221 outputs relative to the number of times the enable signal EN falls.

TABLE 1

| | Number of times EN falls | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| Sc | 1 | 8 | 3 | 10 | 5 | 12 | 7 | 2 | 9 | 4 | 11 | 6 |

Referring to Table 1, the clock selection control signals SC comprise first to twelfth clock selection control signals SC. For example, the counter 221 outputs a first clock selection control signal SC1 when the enable signal EN falls for the first time, and outputs a second clock selection control signal SC2 when the enable signal EN falls for the second time. Likewise, the counter 221 outputs an eleventh clock selection control signal SC11 when the enable signal EN falls for the eleventh time.

As in Table 1, when the enable signal EN falls, the counter 221 selects a clock selection control signal SC to select a clock signal for shortening a low-level period of the control clock signal CCLK. Accordingly, the clock selection control signal SC selected by the counter 221 may vary with the phase and cycle of the clock signal provided to the clock output part 223.

The clock output part 223 selects one of the first to twelfth clock signals CLK1 to CLK12 in response to a clock selection control signal SC. The clock output part 223 receives a kth clock selection control signal SCk (k is a natural number less than or equal to 12) and outputs a kth clock signal CLKk. For example, the clock output part 223 receives the first clock selection control signal SC1 and outputs the first clock signal CLK1, and receives the twelfth clock selection control signal SC12 and outputs the twelfth clock signal CLK12.

Figure 7:
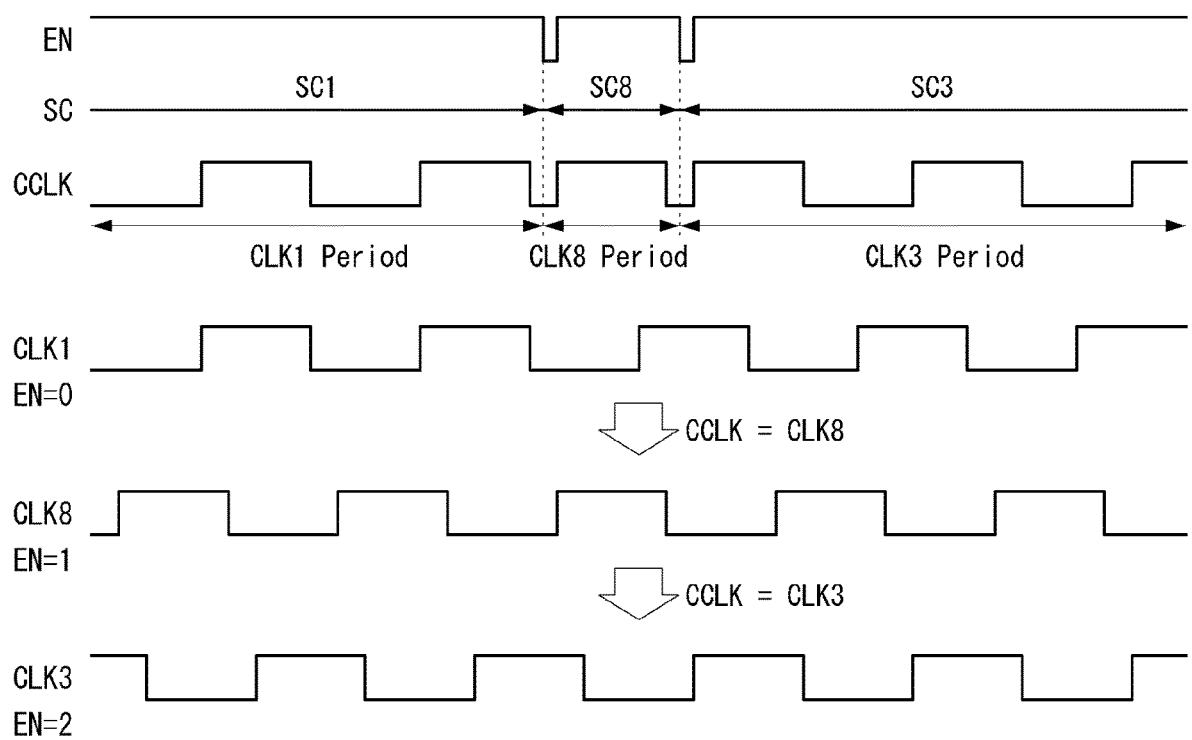
FIG. 7 is a view explaining an embodiment in which the clock output part generates a control clock signal.

FIG. 7 is a view showing control clock signals relative to clock selection control signals outputted from the counter.

Referring to FIG. 7, when the enable signal EN continues to maintain the high level, the counter 221 applies the first clock selection control signal SC1 to the clock output part 223. The clock output part 223 applies the first clock signal CLK1 to the shift register 225, in response to the first clock selection control signal SC1. When the enable signal EN falls to low level for the first time, the counter 221 outputs a clock selection control signal SC for selecting a clock signal whose rising edge timing is the fastest after the application of the enable signal EN. For example, if clock signals have 12 phases as shown in FIG. 6, an eighth clock signal CLK8 is a clock signal whose rising edge timing is the fastest at the point in time when the enable signal EN is applied. Accordingly, when the first enable signal EN is applied, the counter 221 applies the eighth clock selection control signal SC8 to the clock output part 223. The clock output part 223 applies the eighth clock signal CLK8 to the shift register 225, in response to the eighth clock selection control signal SC8.

Likewise, a third clock signal CLK3 is a clock signal whose rising edge timing is the fastest at the point in time when the enable signal EN falls for the second time. Accordingly, when the enable signal EN falls to low level for the second time, the counter 221 applies the third clock signal CLK3 to the shift register 225, in response to a third clock selection control signal SC3.

As a result, the clock output part 223 outputs the first clock signal CLK1 at the point in time when the touch driving period starts, and sequentially outputs the eighth clock signal CLK8 and the third clock signal CLK3 when the enable signal EN falls to low level.

Figure 8:
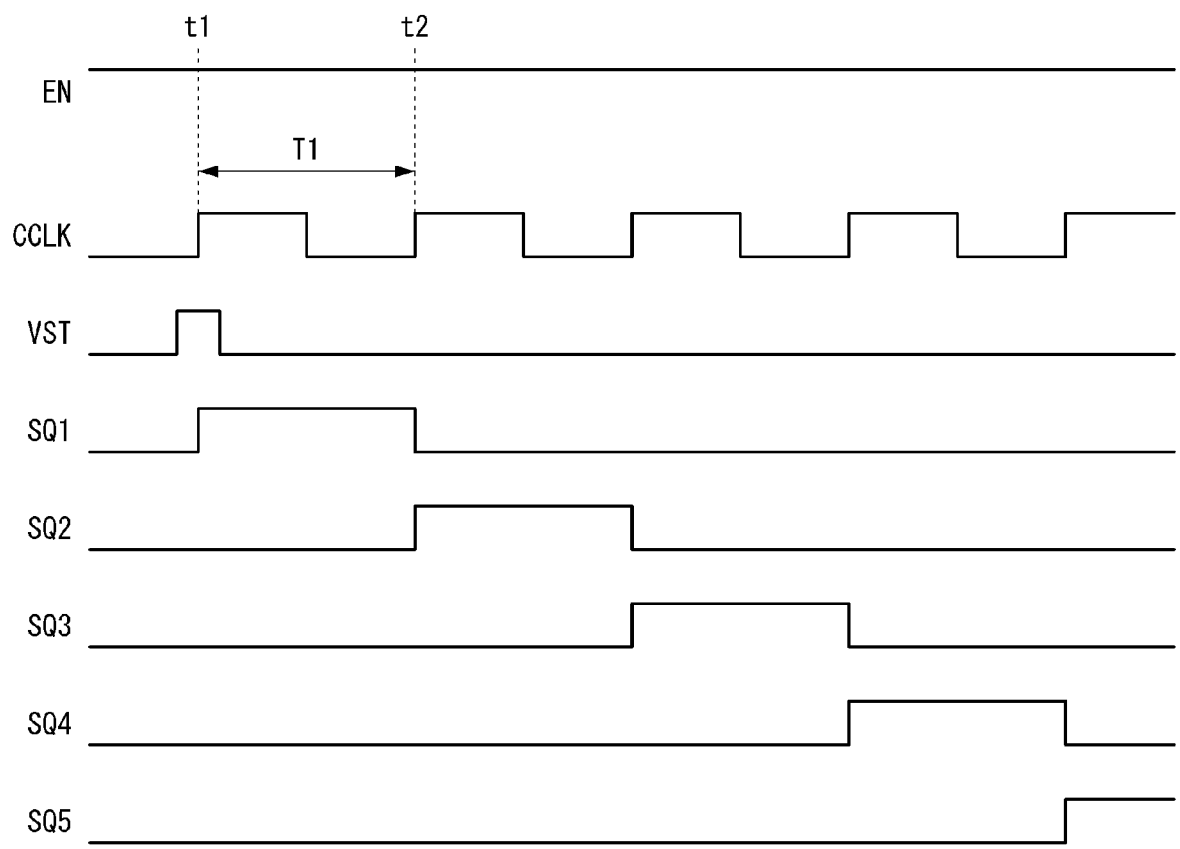
Figure 9:
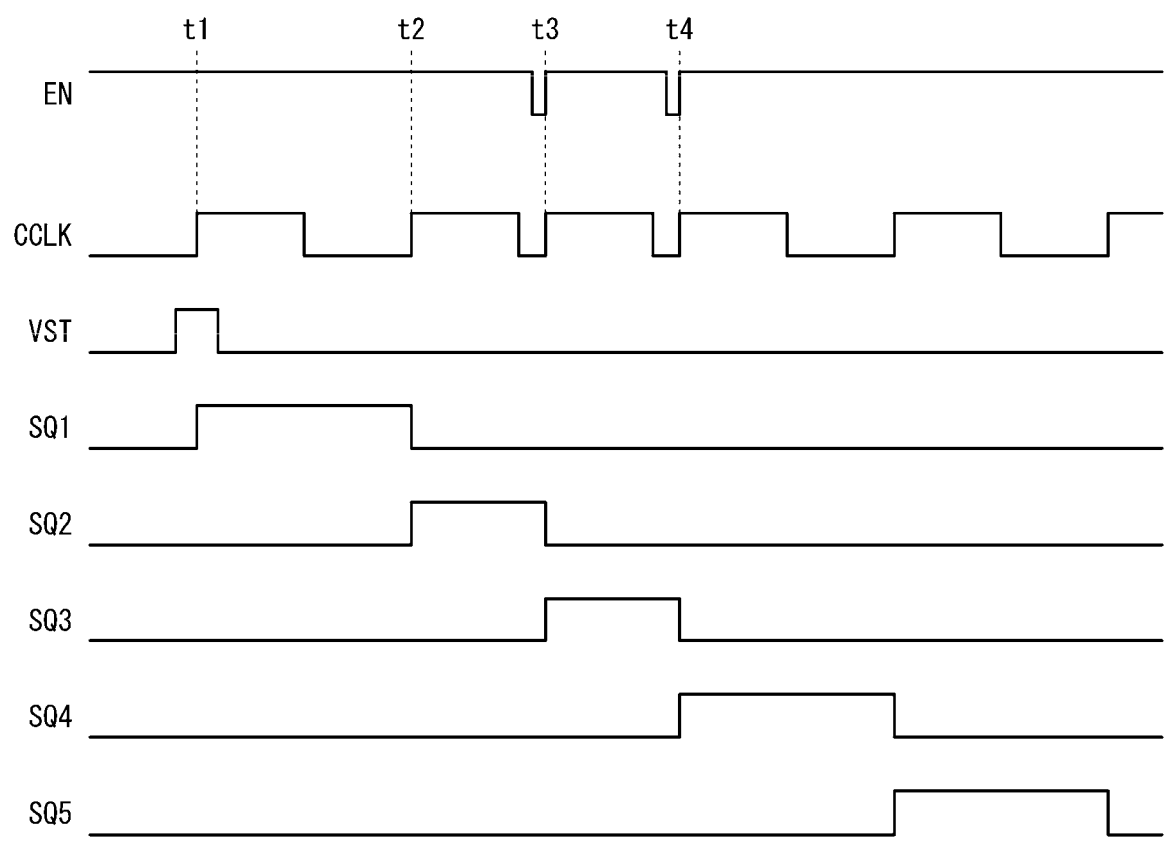

FIGS. 8 to 10 are views showing an exemplary embodiment in which the shift register charges the output nodes. In FIGS. 8 to 10, the first timing refers to the point in time when the touch driving period starts.

FIG. 8 is a view showing an exemplary embodiment in which the shift register charges the output nodes when the enable signal continues to maintain the high level.

Referring to FIG. 8, the shift register 225 receives a start signal VST at the rising edges of a control clock signal CCLK at a first timing t1. When the enable signal EN continues to maintain the high level, the control clock signal CCLK applied to the shift register 225 maintains the state of the first clock signal CLK1. The shift register 225 charges the first output node Q1 when the start signal VST and the control clock signal CCLK are in synchronization with each other.

The control clock signal CCLK rises for the second time at a second timing t2. At the second timing t2, the shift register 225 discharges the first output node Q1 to low level and starts to charge the second output node Q2. In this way, at each rising edge of the control clock signal CCLK, the shift register 225 discharges a (r−1)th output node Q(r−1) (which is a natural number that is 1<r<12) and charges the Q(r−1)th output node Q(r−1).

FIG. 9 is a view showing an exemplary embodiment in which the shift register charges the output nodes when the enable signal falls to low level two times.

Referring to FIG. 9, the shift register 225 receives a start signal VST at the first timing t1, in synchronization with the rising edge of the control clock signal CCLK.

As discussed above, the low-level period of the control clock signal CCLK becomes shorter when the enable signal falls to low level. As a result, the rising edge of the control clock signal CCLK comes faster. That is, the charging period of the second output node Q2 becomes shorter as the interval between the second timing t2 and the third timing t3 becomes shorter. Likewise, the low-level period of the control clock signal CCLK becomes shorter at a fourth timing t4 when the enable signal EN falls for the second time. As a result, the charging period of the third output node Q3 becomes shorter. In this way, the charging period of the second output node Q2 and third output node Q3 becomes shorter when the enable signal EN falls to low level.

Since the enable signal EN maintains the high level after the fourth timing t4, the cycle of the control clock signal CCLK is not changed. As a result, the charging period of the fourth output node Q4 and fifth output node Q5 has one sensed period 1T after the fourth timing t4.

FIG. 10 is a view showing an exemplary embodiment in which the shift register charges the output nodes when the enable signal falls to low level three times or more.

Referring to FIG. 10, the shift register 225 receives a start signal VST at a first timing t1, in synchronization with the rising edge of the control clock signal CCLK.

The low-level period of the control clock signal CCLK becomes shorter when the enable signal falls to low level. As a result, the rising edge of the control clock signal CCLK comes faster. That is, the charging period of the second output node Q2 becomes shorter as the interval between the second timing t2 and the third timing t3 becomes shorter. Likewise, the low-level period of the control clock signal CCLK becomes shorter at a fourth timing t4 when the enable signal EN falls for the second time. As a result, the charging period of the third output node Q3 becomes shorter. In this way, the charging period of the second output node Q2, third output node Q3, fourth output node Q4, and fifth output node Q5 becomes shorter when the enable signal EN repeatedly falls to low level.

Figure 11A:
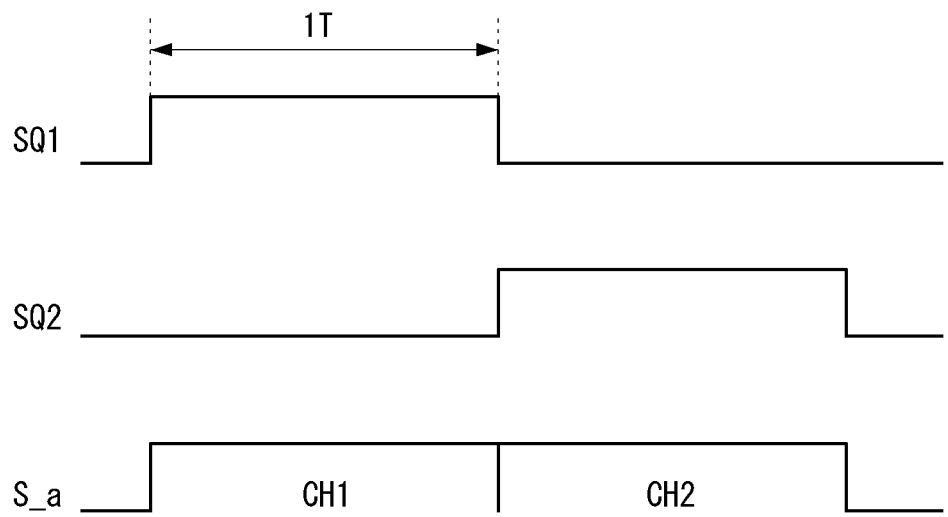
FIGS. 11A and 11B show output periods of multiplexer control signals and an ADC control signal.
Figure 11B:
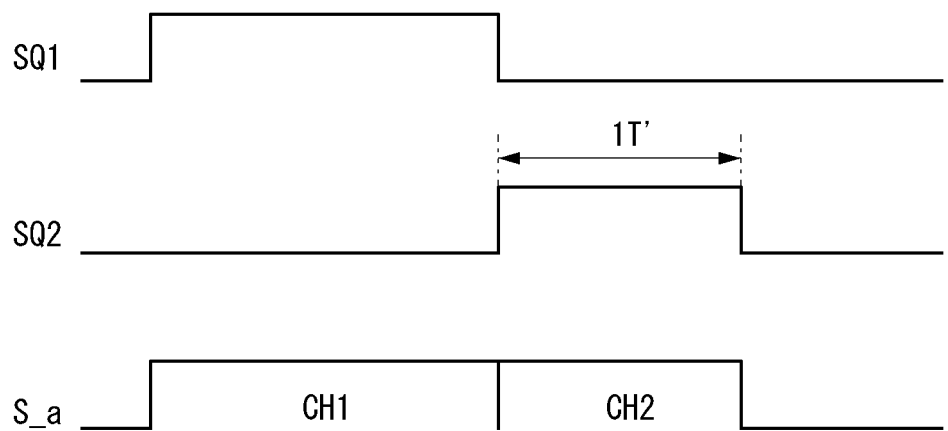

FIGS. 11A and 11B shows output periods of multiplexer control signals and an ADC control signal. FIG. 11A is a view showing output periods of multiplexer control signals and an ADC control signal when sensed voltages of first and second channels are higher than or equal to an offset voltage. FIG. 11B is a view showing output periods of multiplexer control signals and an ADC control signal when a sensed voltage of the first channel is higher than or equal to the offset voltage and a sensed voltage of the second channel is lower than the offset voltage.

Referring to FIGS. 11A and 11B, an ADC control signal S_a corresponds to output periods of multiplexer control signals SQ1 and SQ2. As shown in FIG. 11A, when the enable signal EN is at high level, the output periods of multiplexer control signals SQ1 and SQ2 correspond to one sensed period 1T. As shown in FIG. 11B, when the enable signal EN is at low level in the sensed process of the second channel, the output period 1T' of the multiplexer control signal SQ12 is shorter than one sensed period 1T. Accordingly, when the enable signal EN is at high level, the output period of the ADC control signal S_a corresponds to one sensed period 1T, and when the enable signal EN is at low level, the output period 1T' of the ADC control signal S_a is shorter than one sensed period 1T. As discussed above, in the present disclosure, touch data Tdata is obtained only from touch sensors TC that are assumed to have touch input, rather than converting sensed voltages from every touch sensor TC into touch data Tdata. Moreover, when a sensed voltage Vsen is obtained from touch sensors TC that are regarded as having no touch input, the ADC 240 is not run during the touch driving period. Thus, in the present disclosure, the total operation time of the ADC 240 is not reduced. As a result, a plurality of touch sensors TC may be driven using a small number of ADCs 240. Since the touch sensors TC are driven using a smaller number of ADCs 240 compared to the area of the display panel 100, the present disclosure is more suitable for a large-sized display panel 100. A large-sized display panel 100 can be driven by fewer ADC's 240, saving area, power and manufacturing costs.

As seen above, a display device with built-in touch sensors according to the present disclosure obtains touch data only from touch sensors that are assumed to have touch input, rather than converting sensed voltages from every touch sensor into touch data. Moreover, when a sensed voltage is obtained from touch sensors that are regarded as having no touch input, the ADC is not run. Thus, in the present disclosure, the total operation time of the ADC is not reduced during the touch driving period. As a result, a plurality of touch sensors may be driven using a small number of ADCs.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device with built-in touch sensors comprising:
 a display panel including a plurality of built-in touch sensors, each of the built-in touch sensors configured to generate a sensed voltage based on a detection of touch; and
 a touch driver configured to receive the sensed voltage and convert the sensed voltage sensors into sensed data,
 wherein the touch driver includes:
 an enable signal generator configured to compare the sensed voltage with a threshold voltage and output an enable signal having a first level when the sensed voltage is higher than or equal to the threshold voltage and output the enable signal having a second level when the sensed voltage is lower than the threshold voltage; and
 an analog-to-digital converter configured to convert the sensed voltage into the sensed data when the enable signal is at the first level,
 wherein the touch sensors include a first touch sensor group connected to a first channel and a second touch sensor group connected to a second channel, and
 the touch driver further includes a multiplexer, and
 wherein the multiplexer includes:
 a first switch configured to selectively connect the first channel and the enable signal generator; and
 a second switch configured to selectively connect the second channel and the enable signal generator.

2. The display device of claim 1, wherein the touch driver further comprises a multiplexer controller configured to sequentially output a first control signal for turning on the first switch and a second control signal for turning on the second switch,
 wherein the multiplexer controller sets an output period of the first control signal or second control signal as a first period when the enable signal is at the first level, and sets the output period of the first control signal or second control signal as a second period that is shorter than the first period when the enable signal is at the second level.

3. The display device of claim 2, wherein the multiplexer controller includes:
 a shift register configured to receive a control clock signal and output the first and second control signals; and
 a clock output part configured to output the control clock signal, and shorten a low-level period of the control clock signal when the enable signal is at the second level; and
 wherein each of the first and second control signals each has an output period corresponding to the interval between adjacent rising edges of the control clock signal.

4. The display device of claim 3, wherein the clock output part receives a plurality of clock signals with the same cycle and different phases and outputs one of the clock signals as the control clock signal,
 wherein, when the enable signal is applied at the second level, the clock signal is changed to shorten the low-level period of the control clock signal.

5. The display device of claim 4, wherein one cycle of each of the clock signals is set longer than the time it takes for the analog-to-digital converter to convert the sensed voltage received from one of the touch sensors into the sensed data.

6. The display device of claim 1, wherein the touch driver further comprises an ADC controller configured to output an ADC control signal for controlling the operation of the analog-to-digital converter,
 wherein an output period of the ADC control signal when the enable signal is at the first level is set longer than an output period of the ADC control signal when the enable signal is at the second level.

7. The display device of claim 1, further comprising a touch coordinate generator configured to generate touch coordinates based on sensed data generated by the touch driver.

8. A method of sensing for a touch of a touch screen comprising:
 generating a sensed voltage by sensing a voltage on a touch sensing line;
 comparing the sensed voltage with a threshold voltage;
 outputting an enable signal having a first level when the sensed voltage is equal to or higher than the threshold voltage;
 outputting the enable signal having a second level when the sensed voltage is less than the threshold voltage;
 converting the sensed voltage into digital touch data by analog-to-digital converting,
 wherein the sensing the voltage on the touch sensing line includes:
 selectively connecting a first channel to an enable signal generator; and
 selectively connecting a second channel to the enable signal generator.

9. The method of claim 8, further comprising:
 generating touch coordinates based on the digital touch data.

10. The method of claim 9, further comprising:
 comparing the digital touch data with a digital threshold value;
 allocating an identification code to the digital touch data that is higher than the threshold value, and
 calculating the coordinates of each touch input position for each digital touch data that is above the digital threshold value; and
 transmitting the identification code and touch coordinate information of each digital input data to a host system.

11. The method of claim 8, further comprising:
 sequentially outputting a first control signal for selectively connecting the first channel to the enable signal generator and a second control signal for selectively connecting the second channel to the enable signal generator;

setting an output period of the first control signal or the second control signal as a first period when the enable signal is at the first level; and setting the output period of the first control signal or second control signal as a second period shorter than the first period when the enable signal is at the second level.

12. The method of claim 11, further comprising:

inputting a control clock signal into a shift register;

outputting the first and second control signals from the shift register; and shortening a low-level period of the control clock signal when the enable signal is at the second level.

13. The method of claim 12, further comprising:

outputting an A to D control signal for controlling the operation of the converting the sensed voltage into the digital touch data;

setting an output period of the A to D control signal when the enable signal is at the first level is a first value; and setting an output period of the A to D control signal when the enable signal is at the second level to a second value.

14. The method of claim 13, wherein the first value is longer than the second value.

* * * * *

UNITED STATES PATENT AND TRADEMARK OFFICE
CERTIFICATE OF CORRECTION

PATENT NO. : 10,860,126 B2
APPLICATION NO. : 16/192588
DATED : December 8, 2020
INVENTOR(S) : Joohee Lee et al.

It is certified that error appears in the above-identified patent and that said Letters Patent is hereby corrected as shown below:

In the Claims

Column 9, Claim 1, Line 27:
"sensed voltage sensors into sensed data," should be: --sensed voltage into sensed data,--.

Column 10, Claim 3, Lines 1-2:
"control signals each has an output" should be: --control signals has an output--.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*